United States Patent [19]

Browne et al.

[11] 4,394,616

[45] Jul. 19, 1983

[54] CABLE BREAK LOCATOR

[75] Inventors: Edward M. Browne; Miles A. Smither, both of Houston, Tex.

[73] Assignee: Geosource Inc.

[21] Appl. No.: 207,636

[22] Filed: Nov. 17, 1980

[51] Int. Cl.³ .................... G01R 31/08; G01R 11/52
[52] U.S. Cl. ................................. 324/52; 324/60 C
[58] Field of Search .................. 324/52, 60 C, 60 R

[56] References Cited

U.S. PATENT DOCUMENTS

| | | | |
|---|---|---|---|
| 2,490,377 | 12/1949 | MacLean | 324/52 X |
| 3,230,449 | 1/1966 | Kaiser | 324/60 C |
| 3,248,646 | 4/1966 | Brazee | 324/52 |
| 4,095,174 | 6/1978 | Ishido | 324/52 |

FOREIGN PATENT DOCUMENTS 2931466 10/1980 Fed. Rep. of Germany.

OTHER PUBLICATIONS

Archir Fur Technisches Messen, V35194-1 through V35194-7, 1931 through 1/1960.

Primary Examiner—Stanley T. Krawczewicz
Assistant Examiner—Jose M. Solis
Attorney, Agent, or Firm—Kenneth D. Goodman

[57] ABSTRACT

Method and apparatus for determining the location of a break in a pair of wires of a multi-wire cable are disclosed. The method and apparatus permit such breaks to be found with a high degree of accuracy. The method and apparatus are especially useful in connection with locating breaks in seismic cables.

8 Claims, 4 Drawing Figures

U.S. Patent        Jul. 19, 1983        4,394,616
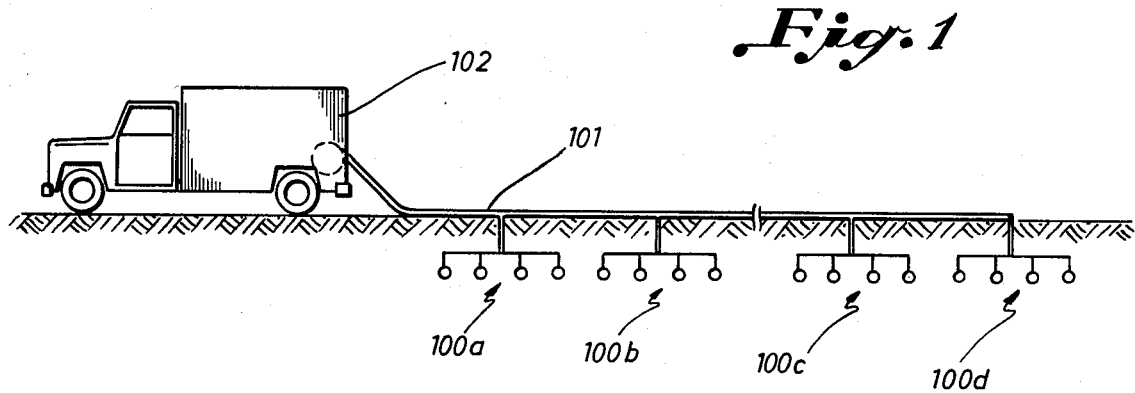
Fig. 1
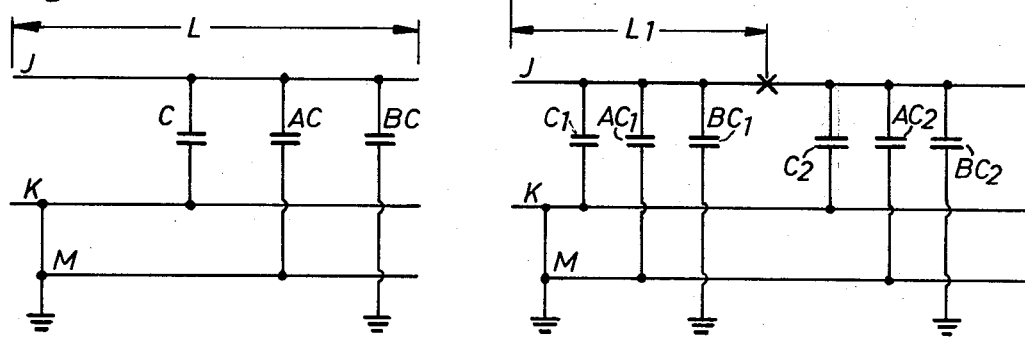
Fig. 3
Fig. 4
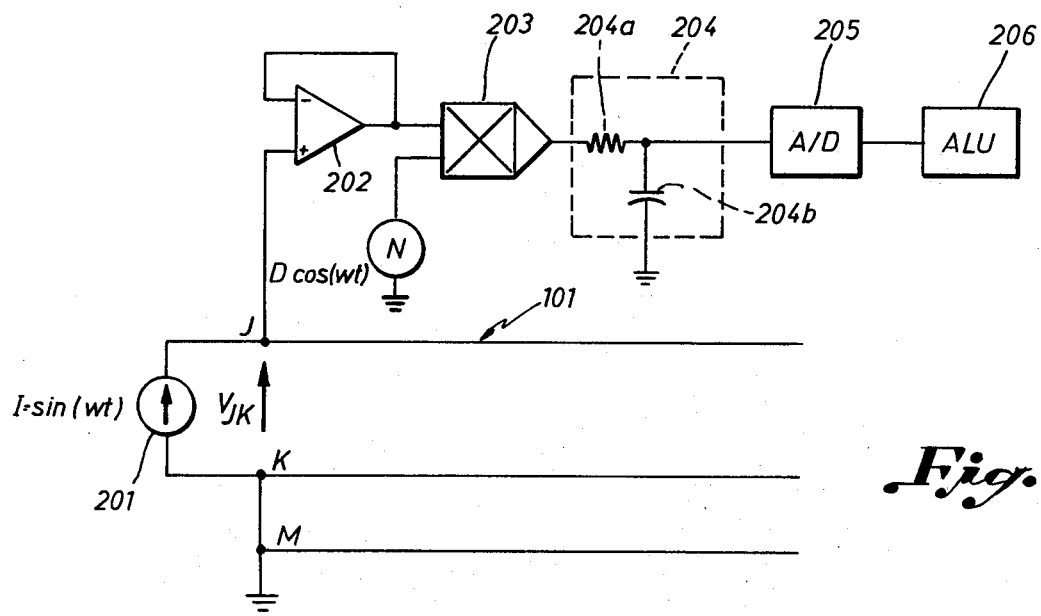
Fig. 2

CABLE BREAK LOCATOR

BACKGROUND OF THE INVENTION

1. Field of the Invention

The present invention relates to method and apparatus for determining the location of a break in a multi-pair cable. Apparatus and method in accordance with the present invention have been found to be especially useful in locating breaks in cables which are used in seismic exploration operations.

2. Description of the Prior Art

In seismic exploration, sound waves are imparted into the earth's crust at a point at or near the earth's surface. Portions of the waves are reflected from subsurface acoustic impedance boundaries, and are sensed by detectors which are arranged in arrays at the surface. The detectors may, for example, be geophones, which convert the reflected seismic waves into electrical signals.

The output of each array constitutes a "channel" of information, which is fed to a recording truck via a pair of wires. Since there are many arrays of detectors in a typical seismic system, there are many pairs of wires in the cable interconnecting the arrays and recording truck. The seismic cables are quite long and contain a plurality of sections. Each section may, for example, be 700 feet in length, and it is not uncommon for a seismic cable to include as many as 48 sections.

Although a seismic cable is farily rugged, it is common knowledge in the industry that the cable is the most vulnerable element in the system. The cable is not only subjected to a wide variety of environmental conditions, but also is flexed, thrown about and even driven over in typical day-to-day operations. A break in one or more of the cable pairs is, therefore, a common daily occurrence which is encountered by seismic crews.

The existance of a break in one of the pairs in the cable may be determined by well-known techniques for testing continuity. Once the existence of a break is determined, it is necessary to determine the location of the break, and, in the case of seismic cable, to replace the section of cable containing the break.

One approach to determine the location of a cable break has been to use a time-domain reflectometer (TDR), which is a device that transmits a pulse of energy down a cable pair. A break in the cable pair constitutes a discontinuity, which causes a portion of the transmitted pulse to be reflected. The duration of the transmitted pulse is sufficiently shorter than the propagation time to the break location so that the reflection returned from the discontinuity is easily distinguished from the original pulse. The location of the break is determined by multiplying one half the time required for the pulse to go down the line and return by a known propagation constant.

TDR has been found to be unsuitable for use with a seismic cable due to the large number of sections in the cable and since the characteristic impedance of each section is slightly different. At each connector joining two sections and with each impedance change, there will be reflections from signals traveling down the line as well as from those returning. Since seismic cable has very bad dispersive properties, the frequency components of the pulse begin separating very quickly, making it very difficult to determine the time at which the pulse returns. Attenuation characteristics diminish the magnitude of the pulse, which further aggravates the problem.

Line impedance measuring instruments have been used to determine a cable break location. These devices are usually operated at low frequencies, and as a principle of operation, assume lines short enough so the line parameters can be considered lumped and the inductive effects of the cable are ignored. This assumption results in the primary line impedance parameter being the shunt capacitance between a twisted pair of wires. By forming the ratio of the value of broken line capacitance to the value of an unbroken line reference capacitance and by multiplying that ratio by the total cable length, the break location is determined. Although capacitance can usually be measured quite accurately, the line impedance measuring method has been found to produce an error of about 20%. With a 48-section seismic cable, the location of the break could be determined within approximately ten sections. This technique has too much error to be useful in seismic applications.

SUMMARY OF THE INVENTION

The method and apparatus of the present invention permit the determination of the location of a break in a given pair of a multi-pair cable with accuracy not realized with prior art techniques. This result is achieved by: (1) exciting a given pair of wires with a current source; (2) eliminating the effects of capacitive coupling between the given pair and the other wires in the cable; and (3) using the quadrature, i.e., imaginary, component of the voltage produced across the given pair by the excitation current as a measure of the capacitance of the given pair.

In one embodiment, the method of the present invention, one wire of the pair to be measured and all other wires in the pair are shorted to ground. This step eliminates the effects of capacitive coupling between the pair under consideration and the other pairs. The given pair is then excited with an AC current, which produces an AC voltage across the given pair. The AC voltage is then multiplied by a second AC signal, which is phased so as to extract a measure of the quadrature component of the voltage across the pair. This measure is compared to a reference measurement to locate the break.

In one embodiment, the comparison step is implemented by filtering the product signal to extract a measure of the quadrature component, digitizing the extracted DC component of the product signal, and using an arithmetic logic unit to compare the digitized DC term to the reference signal.

In accordance with the present invention, apparatus is also provided for determining the location of a break in a given pair of a multi-pair cable. In one embodiment, this apparatus includes means for shorting one wire of the given pair and all other wires in the cable to ground. The apparatus also includes an AC current source, which is connected across the given pair to produce an AC voltage. A multiplier is provided for multiplying the AC voltage by a second AC signal, which is 90° out of phase with the AC current source, to produce a product signal. The apparatus further includes comparison means for comparing the DC component of the product signal to a reference.

In one embodiment, the comparison means comprises a filter for extracting the DC term of the product signal. The DC term is digitized by an analog-to-digital converter and fed to an arithmetic logic unit for comparison to the reference voltage.

BRIEF DESCRIPTION OF THE DRAWINGS

In the accompanying drawings:

FIG. 1 is a pictorial diagram which illustrates certain components of a seismic exploration.

FIG. 2 is an electrical schematic diagram which illustrates method and apparatus in accordance with the present invention.

FIG. 3 is an electrical schematic diagram which illustrates the distributed capacitive components of an unbroken pair of wires in a cable connected as shown in FIG. 2.

FIG. 4 is an electrical schematic diagram which illustrates the distributed capacitive components of a broken pair of wires in a cable connected as shown in FIG. 2.

DESCRIPTION OF SPECIFIC EMBODIMENTS

It will be appreciated that the present invention can take many forms and embodiments. Some embodiments of the invention are described so as to give an understanding of the invention. It is not intended, however, that the illustrative embodiments herein set forth should in any way limit the scope of the invention.

With reference first to FIG. 1, a typical seismic exploration system includes a plurality of arrays 100a–100d of seismic detectors, which are located at spaced intervals along the surface of the earth. The detectors in arrays 100a–100d may, for example, be geophones. The seismic exploration system also includes seismic cable 101 which is preferably a multi-pair cable, and a pair of wires from cable 101 is "taken out" of the cable and connected to the output of each array 100a–100d. Each array 100a–100d produces an electrical signal in response to seismic waves which are reflected from subsurface formations, and the electrical signal from each array 100a–100d is conveyed via its respective pair in cable 101 to recording truck 102. Recording truck 102 includes apparatus (not shown) for recording the received electrical signals in an appropriate manner.

Although not illustrated in FIG. 1, a typical seismic cable includes a plurality of sections, and cable 101 may, for example, include 48 sections, with each section being 700 feet in length. Since the output of each array 100a–100d is conveyed to recording truck 102 over a separate pair of wires of cable 101, it is apparent that a break in one of the pairs of wires prevents information from the array to which it is connected from reaching the recording truck 102. It is, of course, imperative that the existence of such breaks be determined as quickly as possible and that the section or sections containing the break be located and those sections of the cable replaced.

With reference now to FIG. 2, one pair of wires of cable 101 is designated as having wires J and K, while all the remaining pairs of wires are designated M. Suppose that pair J–K is the pair to be tested for a break. In accordance with the present invention, wire K and all other wires M are shorted to ground.

This shorting technique eliminates many of the effects of the capacitive between pair J–K and the remainder of the pairs M in cable 101. For example, as shown in FIG. 3, the capacitance for an unbroken pair having wire K and all other wires M shorted to ground include: (1) C, which represents the capacitance between wires J and K; (2) AC which represents the sum of all capacitive coupling between wire J and wires M; and (3) BC, which represents the sum of all capacitive coupling between wire J and ground. A broken pair, as shown in FIG. 4, has similar coupling capacitances on each side of the break, which is marked with the X.

Referring again to FIG. 2, an embodiment of the present invention comprises AC current source 201, which has a value proportional to sin(wt) and which is connected across wires J–K of the pair under consideration. Preferably, the frequency of AC current source 201 is variable. AC current source 201 causes a voltage $V_{JK}$ to be produced across wires J–K of the pair under consideration. Voltage $V_{JK}$ is given by the expression:

$$V_{JK} = I\left(R_s + \frac{1}{\left(\frac{1}{R_p}\right) + sC}\right)$$

where $R_s$ is the value of the distributed series resistance of pair J–K, $R_p$ is the value of the leakage resistance between wires J and K, and C is the value of the distributed capacitance of pair J–K.

In practical cables measured at a practical frequency such that the value of sC is greater than the value $1/R_p$, the value of voltage $V_{JK}$ may be approximated as follows:

$$V_{JK} = I\left(R_s + \frac{1}{sC}\right)$$

Still referring to FIG. 2, an embodiment of the present invention also comprises buffer device 202, whose non-inverting input is connected to wire J and whose inverting input is connected to its output. Buffer device 202 preferably has a high input impedance, so as not to load pair J–K. In a preferred embodiment, buffer device 202 is an operational amplifier having unity gain.

An embodiment of the present invention also includes multiplier 203. The output of buffer device 202 is connected to one input of multiplier 203, and the second input of multiplier 203 is connected to a second AC voltage having a value D cos(wt), where D is a scaling factor having an arbitrary value. The signal D cos(wt) is at all times 90° out of phase with the signal at the output of AC current source 201. Multiplier 203 is preferably a transconductance analog multiplier, such as manufactured by Analog Devices, Inc.

The voltage appearing at the output of multiplier 203 is the product of $V_{JK}$ times the quantity D cos(wt), and is sometimes hereinafter referred to as the product signal.

The real component of $V_{JK}$ is represented at the output of multiplier 203 by a sinusoidal waveform whose average value is zero. The quadrature component of $V_{JK}$ is represented at the output of multiplier 203 by a waveform whose DC (average) value is proportional to said quadrature component.

An embodiment of the present invention also includes a low pass filter 204, and the voltage appearing at the output of multiplier 203 is fed to filter 204. Since the average value of the sinusoidal terms of the voltage at the output of multiplier 203 is zero, the magnitude of the voltage appearing at the output of filter 204 is equal to the DC component of the voltage at the output of multiplier 203. Filter 204 may, for example, include resistor 204a and capacitor 204b, and, in a present embodiment, the value of resistor 204a is 100,000 ohms, while the value of capacitor 204b is 100 microfarads. The output voltage of filter 204 will contain the DC value of the output voltage of multiplier 203 which is proportional to the quadrature component of the cable voltage $V_{JK}$. It will be appreciated that more complex filters may be employed, such as filters whose transfer functions have multiple poles.

The output of filter 204 is fed to the input of analog-to-digital converter 205, which digitizes the voltage at the output of filter 204. This digitized value is then fed to the arithmetic logic unit 206 or a microcomputer (not shown). The voltage input from analog-to-digital converter 205 is compared to a reference which is stored in arithmetic logic unit 206. The reference may be generated prior to measuring the broken pair from the signal developed at the output of analog-to-digital converter from an unbroken pair in the same cable.

Referring now to FIGS. 2, 3 and 4, suppose that the pair J–K under consideration in FIG. 2 contains no break, as shown in FIG. 3. That pair has a distributed capacitance over its length L whose value is $(1+A+B)$ C, and the DC component of the voltage at the output of multiplier 203 is inversely proportional to the value of capacitance $(1+A+B)$ C. In this instance, the voltage presented to arithmetic logic 206 by analog-to-digital converter 205 would be the reference voltage, which would be stored in a memory address for later comparison to the broken wire.

Suppose, however, that the pair J–K under consideration has a break at distance L1, as illustrated diagrammatically in FIG. 4. In that event, the broken pair has the distributed capacitances shown in FIG. 4. In this instance, the DC component of the voltage at the output of multiplier 203 is inversely proportional to the value of $(1+A+B)$ Cl. Since the distance Ll is given by the expression:

$$L1 = \frac{(L)(C1)}{C},$$

the voltage from analog-to-digital converter 206, which is presented to arithmetic logic unit 206 in this instance, is used to determine the value Ll; L being known and C having been measured.

With the method and apparatus of the present invention, it has been found that breaks in a seismic cable may be located within a tolerance of approximately two percent. For a 48-section cable, the method and apparatus of the present invention operates to locate the cable break within approximately one section of cable.

What is claimed is:

1. A method of determining the location of a break in a given pair of wires in a multi-pair cable, comprising the steps of:
   (a) shorting one wire of the given pair and all other wires in the cable to ground;
   (b) applying a variable frequency AC current source across the given pair to develop an AC voltage across the given pair;
   (c) multiplying the AC voltage developed across the given pair by a second AC signal, which has a quadrature phase relationship to the AC current source to form a product signal having a DC component proportional to the quadrature component of the AC voltage across the given pair; and
   (d) comparing the DC component of said product signal to a reference signal, said reference signal having a value which is inversely proportional to the capacitance of an unbroken pair.

2. The method of claim 1, where step (d) comprises the steps of:
   filtering the product signal to extract the DC component of the product signal;
   digitizing the extracted DC component; and
   feeding the digitized DC component to an arithmetic logic unit for comparison to the reference signal.

3. The method of claim 1 or claim 2, wherein the method further comprises the step of buffering the voltage developed across the given pair before it is multiplied by the second AC voltage.

4. The method of claim 1, wherein the multi-pair cable is a seismic cable comprising a plurality of sections.

5. The method of claim 4, wherein the method comprises the further steps of:
   identifying the location of a break in the given pair based on the comparison of step (d); and
   replacing the section of cable when the break is located.

6. Apparatus for determining the location of a break in a given pair of a multi-pair cable, which comprises:
   means for shorting one wire of the given pair and all other wires in the cable to ground;
   a variable frequency AC current source which is connected across the wires of the given pair to produce an AC voltage across the given pair;
   a multiplier for multiplying the voltage produced across the given pair by a second AC signal, which is in a quadrature phase relationship to the AC current source to form a product signal; and
   means for comparing the DC component of the product signal to a reference signal, said reference signal having a value which is inversely proportional to the capacitance of an unbroken pair.

7. The apparatus of claim 6, wherein the comparison means comprises:
   a filter for extracting from the product signal the DC component;
   an analog-to-digital converter for digitizing the DC component of the product signal; and
   an arithmetic logic unit for comparing the digitized DC component of the product signal to the reference signal.

8. The apparatus of claim 6 or claim 7, wherein it further includes means for buffering the AC voltage produced across the given pair of wires, before it is multiplied by the second AC signal by the multiplier.

* * * * *

UNITED STATES PATENT AND TRADEMARK OFFICE
CERTIFICATE OF CORRECTION

PATENT NO. : 4,394,616

DATED : July 19, 1983

INVENTOR(S) : EDWARD M. BROWNE and MILES A. SMITHER

It is certified that error appears in the above--identified patent and that said Letters Patent is hereby corrected as shown below:

(Col. 3, Line 60), after "capacitive" insert -- coupling --.
(Col. 3, Line 65), after "AC" add -- , --.
(Col. 6, Line 29), "when" should read -- where --.

Signed and Sealed this

Eighth Day of November 1983

[SEAL]

Attest:

GERALD J. MOSSINGHOFF

Attesting Officer — Commissioner of Patents and Trademarks